US006587355B2

(12) United States Patent
Park et al.

(10) Patent No.: US 6,587,355 B2
(45) Date of Patent: Jul. 1, 2003

(54) LIQUID CRYSTAL DISPLAY MODULE WITH IMPROVED GROUND CONNECTION

(75) Inventors: Jong Dae Park, Kyoungsangbuk-do (KR); Jae Ho Hwang, Kyoungsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 76 days.

(21) Appl. No.: 09/893,992

(22) Filed: Jun. 29, 2001

(65) Prior Publication Data
US 2002/0085340 A1 Jul. 4, 2002

(30) Foreign Application Priority Data
Dec. 30, 2000 (KR) .......................... 2000-86842

(51) Int. Cl.[7] .............. H05K 7/14; H05K 9/00; G02F 1/1333
(52) U.S. Cl. ............ 361/799; 361/681; 361/800; 361/801; 174/35 R; 174/51; 349/58
(58) Field of Search ............... 361/681, 799, 361/800, 801, 816, 818; 174/35 R, 51; 349/58

(56) References Cited

U.S. PATENT DOCUMENTS 5,926,237 A * 7/1999 Yun et al. ............... 349/58
6,175,396 B1 * 1/2001 Kim et al. ............... 349/58
6,212,067 B1 * 4/2001 Nakajima et al. ........ 361/681

FOREIGN PATENT DOCUMENTS

JP   11-109398   4/1999
KR   2000-7521   2/2000

* cited by examiner

Primary Examiner—Jayprakash N. Gandhi
(74) Attorney, Agent, or Firm—Morgan, Lewis & Bockius LLP

(57) ABSTRACT

A liquid crystal display module that is adaptive for improving a ground connection between a printed circuit board and a ground plate. In the module, a top case is provided with a horizontal plane part and a vertical plane part bent vertically from the horizontal plane part to enclose the edge of the liquid crystal display panel. A ground plate is provided with an outer vertical supporting member being in contact with the outside of the vertical plane part of the top case to earth a printed circuit board. Accordingly, the plate is in double contact with the inside and the outside of the top case, so that the plate can be in contact with the top case in spite of a movement of the top case.

20 Claims, 12 Drawing Sheets

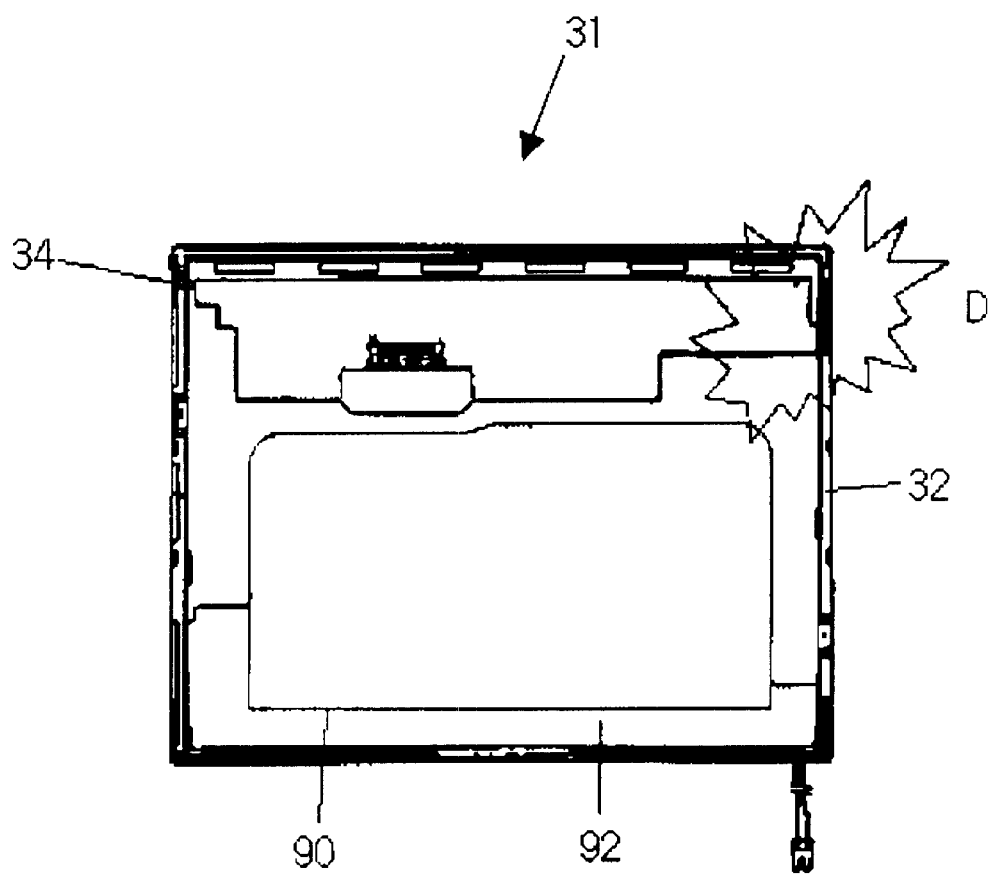

LIQUID CRYSTAL DISPLAY MODULE WITH IMPROVED GROUND CONNECTION

BACKGROUND OF THE INVENTION

1. Field of the Invention

This invention relates to a liquid crystal display, and more particularly to a liquid crystal display module that is adaptive for improving a ground connection between a printed circuit board and a ground plate.

2. Description of the Related Art

Generally, a liquid crystal display module consists of a liquid crystal panel and a driving circuitry for driving the liquid crystal display panel. The liquid crystal display panel includes liquid crystal cells arranged between two glass substrates in a matrix type, and switching devices for switching signals applied to the liquid crystal cells. Since the liquid crystal display module includes a glass substrate and thus is liable to be damaged due to an external impact, a case for enclosing the outside of the liquid crystal display module to protect the liquid crystal display module has been used in order to prevent a damage of the liquid crystal display module caused by an external impact.

Referring to FIG. 1, a liquid crystal module 1 includes a liquid crystal display panel 80, a frame 82 made from a plastic material, and a top case 2 engaged to the frame 82 to enclose the edge of the liquid crystal display module 1.

The liquid crystal panel 80 has a printed circuit board (PCB) 4 mounted with a driving circuitry (not shown). The plastic frame 82 is provided with a lamp for a backlight (not shown), a light guide and sheets for light reflection, diffusion and focusing, etc.

The liquid crystal display panel 80 is inserted into latches (not shown) provided at the front side corner of the plastic frame 82 to fix it to the plastic frame 82. At this time, the PCB 4 is folded in such a manner to enclose the rear side of the plastic frame 82 to be positioned at the upper rear side of the plastic frame 82. The plastic frame fixed with the liquid crystal display panel 80 in this manner is inserted into the top case 2, and then secured to it by means of an engaging member.

As described above, the liquid crystal display module 1 includes the liquid crystal display panel 80, the plastic frame 82 and the top case 2, etc. The PCB 4 is very liable to be damaged by a static electricity generated from the attached driving circuitry and the interior of the liquid crystal display module 1. Accordingly, a ground part is provided at the top case 2, as shown in FIG. 2A and FIG. 2B, in order to protect the PCB 4 from a static electricity.

FIG. 2A and FIG. 2B are a detailed section view and a side view representing a ground part A of the liquid crystal display module 1 shown in FIG. 1, respectively.

Referring to FIG. 2A and FIG. 2B, the ground part of the conventional liquid crystal display module 1 includes a PCB 4 mounted with a driving circuitry for applying a driving signal to a liquid crystal display panel, a top case 2 that takes the form of bracket and is provided with a ground part for preventing the PCB 4 from a static electricity, and a plate 3 installed at the inside of the top case 2 to contact the PCB 4 with the ground part of the top case 2.

The PCB 4 is mounted with a driving circuitry for applying a data signal and a scanning signal, etc. to the liquid crystal display panel (not shown). The top case 2 plays a role to enclose the edge of the liquid crystal display panel. Also, the top case 2 is provided with a ground part as shown in FIG. 3A for preventing the PCB 4 from a static electricity generated upon assembly of circuit components or a static electricity generated at the interior of the system.

Referring to FIG. 3A, the top case 2 consists of a horizontal plane part 18 and a vertical plane part 19 bent vertically from the horizontal plane part 18. The inside of the vertical plane part 19 is provided with a copper film 12, that is, a grounding part connected to a ground terminal (not shown). The plate 3 takes a shape as shown in FIG. 3B so as to contact the PCB 4 with the copper film 12 of the top case 2.

Referring to FIG. 3B, the plate 3 includes a horizontal plane part 11 on which the PCB 4 is put, and a vertical supporting member 23 extended vertically and bent from one side thereof.

The horizontal plane part 11 is provided with a first screw hole 14 for fixing the PCB 4. The vertical supporting member 23 is provided with at least one protrusion 10 to be in contact with the copper film 12 of the top case 2. The plastic frame 82 in FIG. 1 is inserted between the horizontal plane part 11 and the vertical supporting member 23.

A static electricity generated from the driving circuitry mounted onto the PCB 4 contacts the copper film 12 of the top case 2 via the protrusion 10 provided at the vertical supporting member 23 of the plate 3 to flow into a ground terminal. In other words, the PCB 4 is in contact with the copper film 12 of the top case 2 via the plate 3 and grounded, thereby protecting the PCB 4 from a static electricity. This will be described in detail with reference to FIG. 4A and FIG. 4B.

FIG. 4A is a section view taken along the line B–B' line in FIG. 2A, and FIG. 4B is a section view taken along the line C–C' line FIG. 2B.

Referring to FIG. 4A and FIG. 4B, the PCB 4 becomes in contact with the plate 3 and fixed by passing a first screw 17 through a hole (not shown) defined on the PCB 4 and through a first screw hole 14 of the plate 3 and then inserting it into a first screw hole 16 formed at the plastic frame 82.

The plate 3 is fixed by passing a second screw (not shown) through a second screw hole (not shown) defined at the plate 3 and then inserting it into a second screw hole (not shown) defined at the plastic frame 82. The outer side of the plate 3 is covered with the top case 2. Accordingly, the protrusion 10 formed at the plate 3 is in contact with the copper film 12 formed at the inside of the top case 2. As a result, the PCB 4 is earthed to the copper film 12 via the plate 3, to thereby be protected from a static electricity generated upon assembly work and a static electricity generated from the interior of the system.

Further, the top case 2 covers the outer side of the PCB 4 and the plate 3, etc. by engaging a third screw 28 to the plastic frame 82 through a third screw hole 26 shown in FIG. 2A and FIG. 2B. At this time, the top case 2 raises a problem in that it is widened toward the outside thereof by X as shown in FIG. 5 when an engaging force of the third screw 28 is excessively strong.

This problem makes a grounding of the PCB 4 into the top case 2 impossible. Accordingly, the drivers (not shown) mounted onto the PCB 4 are damaged by a static electricity generated upon assembly work or a static electricity generated from the internal system. As a result, there occurs a problem in that a picture fails to be displayed on the liquid crystal display panel 80 due to such a damage of the drivers mounted onto the PCB 4.

SUMMARY OF THE INVENTION

Accordingly, it is an object of the present invention to provide a liquid crystal display module that is adaptive for improving a ground connection between a printed circuit board and a ground plate.

In order to achieve these and other objects of the invention, a liquid crystal display module according to an embodiment of the present invention includes a printed circuit board for applying signals to a liquid crystal display panel; a top case provided with a horizontal plane part and a vertical plane part bent vertically from the horizontal plane part to enclose the edge of the liquid crystal display panel; and a ground plate provided with an outer vertical supporting member being in contact with the outside of the vertical plane part of the top case to earth the printed circuit board.

In the liquid crystal display module, the top case includes a concave portion that is concavely defined at one side of the vertical plane part to be in contact with the outer vertical supporting member. The ground plate includes an inner vertical supporting member formed vertically to be in contact with the inside of the vertical plane part of the top case.

Further, the outer vertical supporting member has at least one protrusion being in contact with the concave portion of the top case and the inner vertical supporting member has at least one protrusion being in contact with the vertical plane part of the top case.

In the liquid crystal display module, the ground plate is made from an electrical-conductive material. The ground plate is a copper film.

A liquid crystal display module according to another aspect of the present invention includes a printed circuit board for applying signals to a liquid crystal display panel; a top case provided with a horizontal plane part and a vertical plane part bent vertically from the horizontal plane part to enclose the edge of the liquid crystal display panel; a ground plate provided with an outer vertical supporting member being in contact with the outside of the vertical plane part of the top case to earth the printed circuit board; and a plastic frame for supporting the ground plate.

In the liquid crystal display module, the top case includes a concave portion that is concavely defined at one side of the vertical plane part to be in contact with the outer vertical supporting member. The ground plate includes an inner vertical supporting member formed vertically to be in contact with the inside of the vertical plane part of the top case.

Further, the outer vertical supporting member has at least one protrusion being in contact with the concave portion of the top case and the inner vertical supporting member has at least one protrusion being in contact with the vertical plane part of the top case.

In the liquid crystal display module, the ground plate is made from an electrical-conductive material. The ground plate is a copper film.

BRIEF DESCRIPTION OF THE DRAWINGS

These and other objects of the invention will be apparent from the following detailed description of the embodiments of the present invention with reference to the accompanying drawings, in which:

FIG. 6 is a plan view showing a structure of a liquid crystal display module according to an embodiment of the present invention;

DETAILED DESCRIPTION OF THE PREFERRED EMBODIMENT

Figure 1:
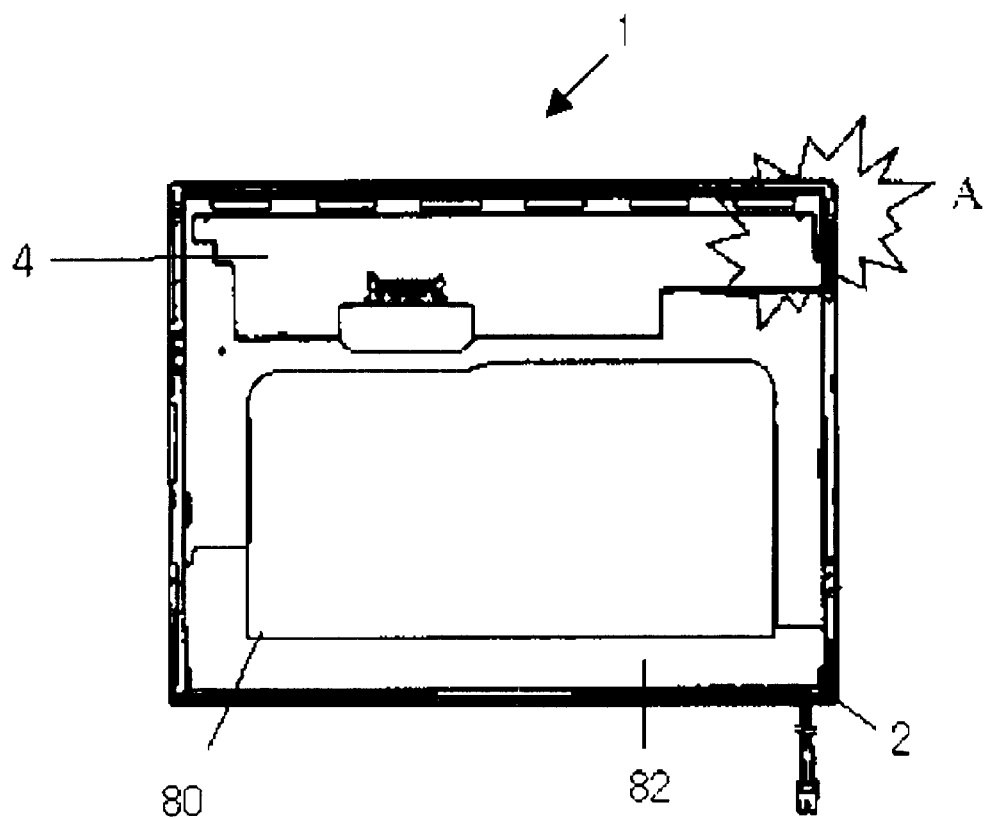
FIG. 1 is a plan view showing a structure of a conventional liquid crystal display module.
Figure 2A:
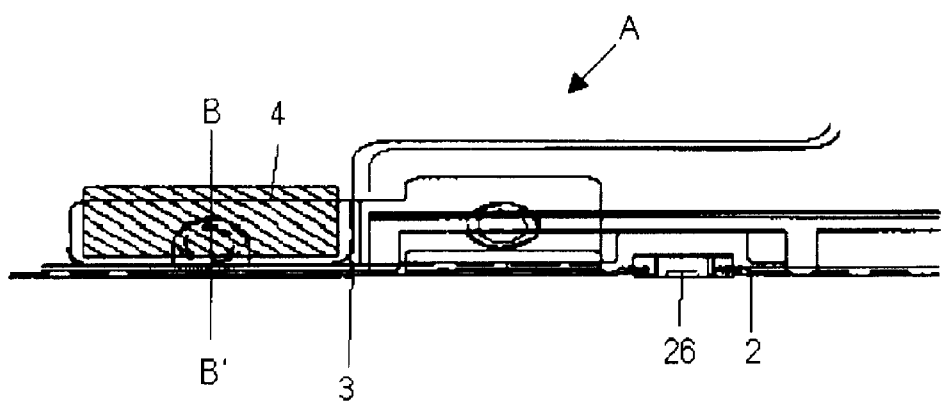
FIG. 2A and FIG. 2B are a detailed section view and a side view representing a ground part A of the liquid crystal display module shown in FIG. 1, respectively.
Figure 2B:
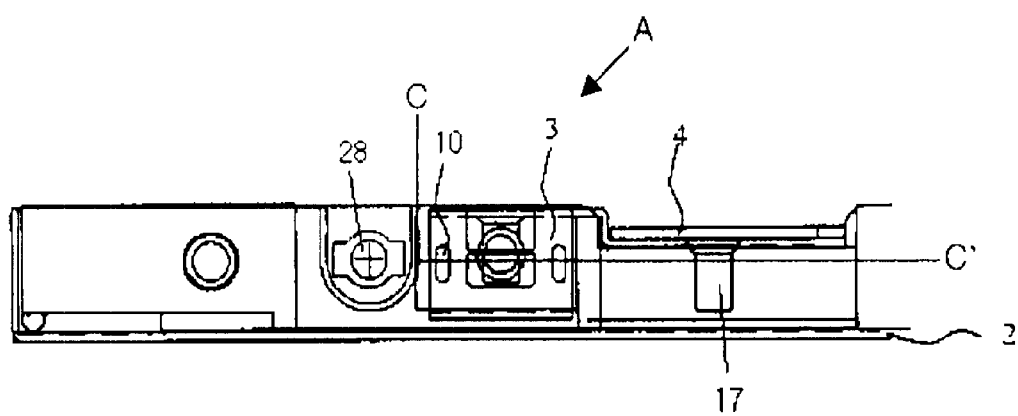
Figure 3A:
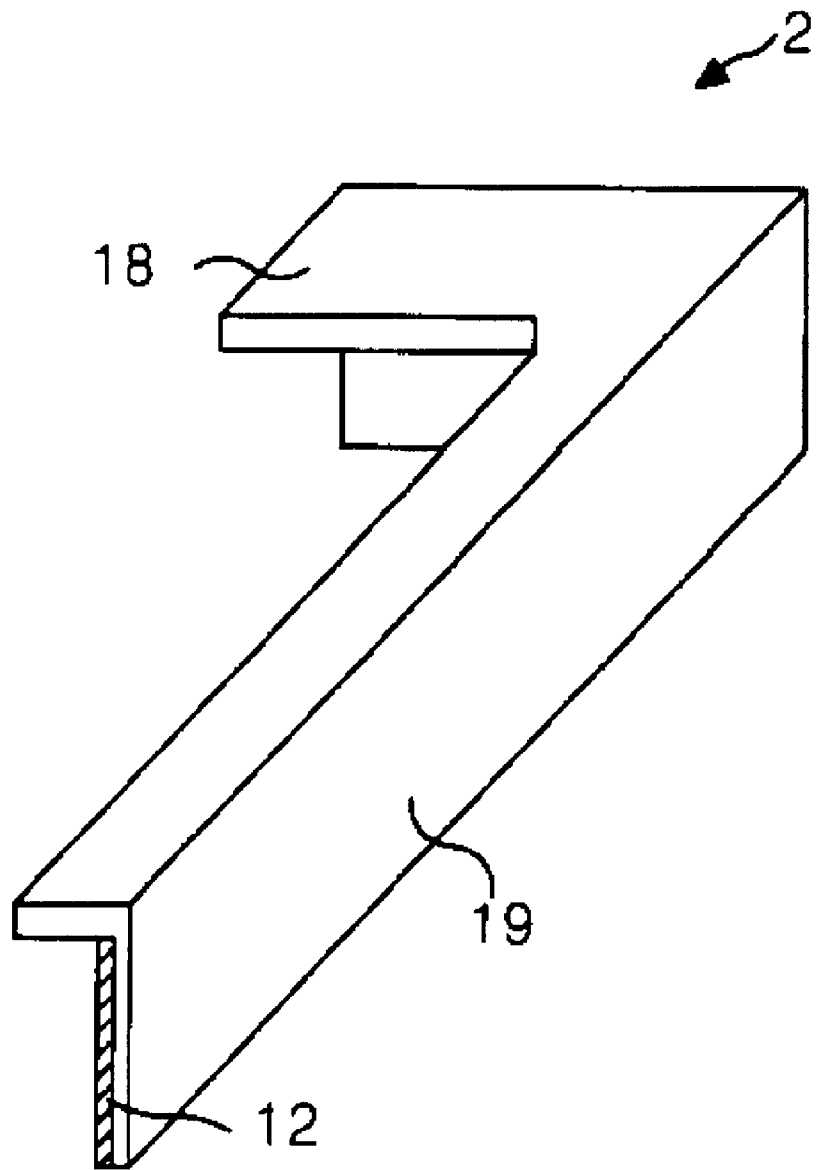
FIG. 3A is a perspective view of a conventional top case.
Figure 3B:
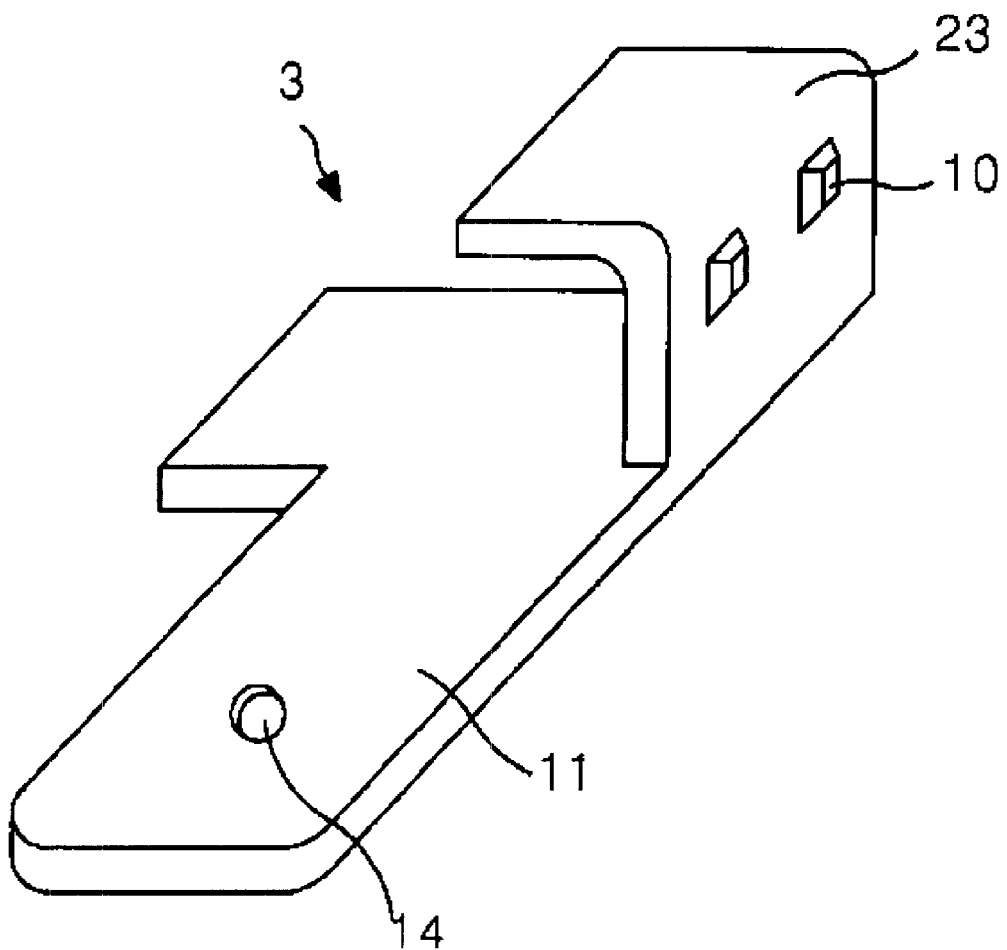
FIG. 3B is a perspective view of a conventional plate.
Figure 4A:
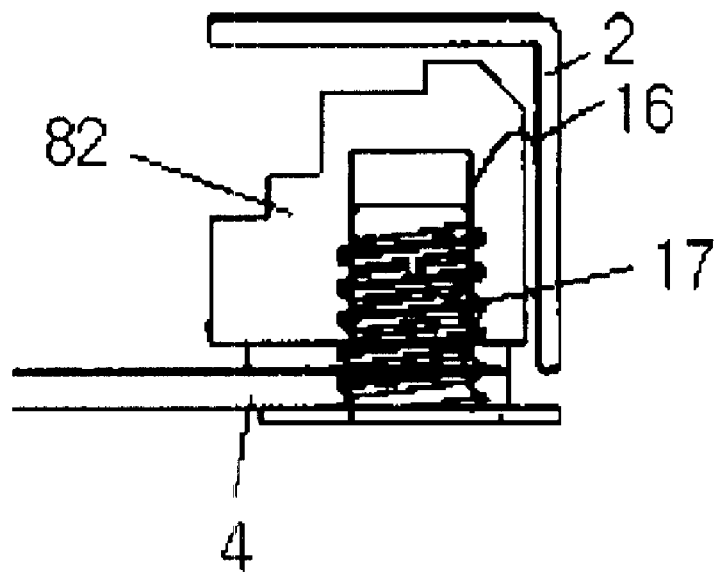
FIG. 4A is a section view taken along the B–B' line in FIG. 2A.
Figure 4B:
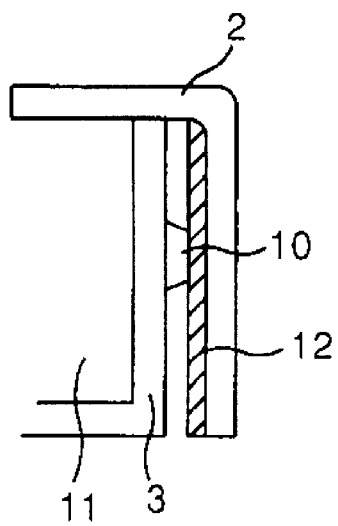
FIG. 4B is a section view taken along the C–C' line in FIG. 2B.
Figure 5:
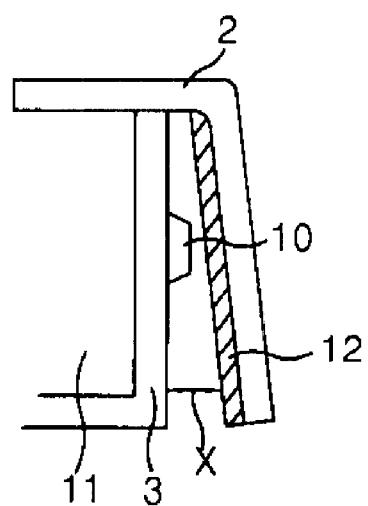
FIG. 5 shows a bad grounding state caused by a widening of the top case in FIG. 3A.

Referring to FIG. 6, there is shown a liquid crystal display module 31 in a notebook personal computer according to an embodiment of the present invention.

The liquid crystal display module 31 includes a liquid crystal display panel 90, a frame 92 made from a plastic material, and a top case 32 engaged to the frame 92 to enclose the edge of the liquid crystal display module 31.

The liquid crystal panel 90 has a printed circuit board (PCB) 34 mounted with a driving circuitry (not shown). The plastic frame 92 is provided with a lamp for a backlight (not shown), a light guide and sheets for light reflection, diffusion and focusing, etc.

The liquid crystal display panel 90 is inserted into latches (not shown) provided at the front side corner of the plastic frame 92 to fix it to the plastic frame 92. At this time, the PCB 34 is folded in such a manner to enclose the rear side of the plastic frame 92 to be positioned at the upper rear side of the plastic frame 82.

The plastic frame 92 fixed with the liquid crystal display panel 90 in this manner is inserted into the top case 2, and then motionlessly secured to it by means of an engaging member.

As described above, the liquid crystal display module 31 includes the liquid crystal display panel 90, the plastic frame 92 and the top case 32, etc. The PCB 34 is very liable to be damaged by a static electricity generated from the attached driving circuitry and the interior of the liquid crystal display module 31. Accordingly, a ground part is provided at the top case 32, as shown in FIG. 7A and FIG. 7B, in order to protect the PCB 34 from such a static electricity.

Figure 7A:
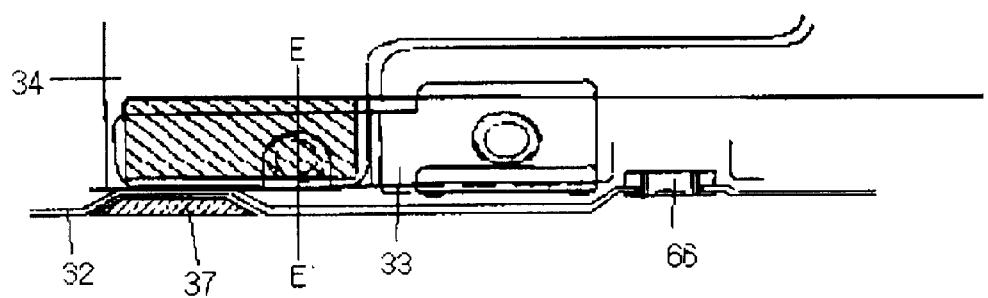
FIG. 7A and FIG. 7B are a detailed section view and a side view representing a ground part D of the liquid crystal display module shown in FIG. 6, respectively.
Figure 7B:
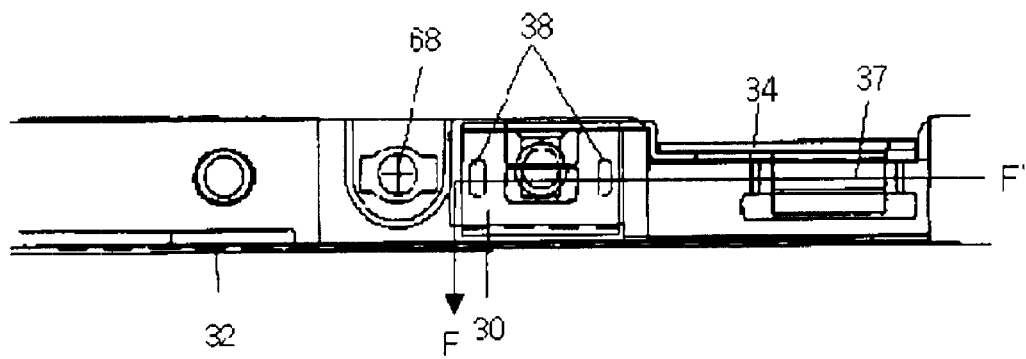

FIG. 7A and FIG. 7B are a detailed section view and a side view representing a ground part D of the liquid crystal display module 31 shown in FIG. 6, respectively.

Referring to FIG. 7A and FIG. 7B, the ground part of the conventional liquid crystal display module 31 includes a PCB 34 mounted with a driving circuitry for applying a driving signal to a liquid crystal display panel, a top case 32 that takes the form of bracket and is provided with a ground part for preventing the PCB 34 from a static electricity, and a plate 33 installed at the inside of the top case 32 to contact the PCB 34 with the ground part of the top case 32.

The PCB 34 is mounted with a driving circuitry for applying a data signal and a scanning signal, etc. to the liquid crystal display panel (not shown). The top case 32 plays a role to enclose the edge of the liquid crystal display panel. Also, the top case 32 is provided with a ground part as shown in FIG. 8A for preventing the PCB 34 from a static electricity generated upon assembly of circuit components or a static electricity generated at the interior of the system.

Figure 8A:
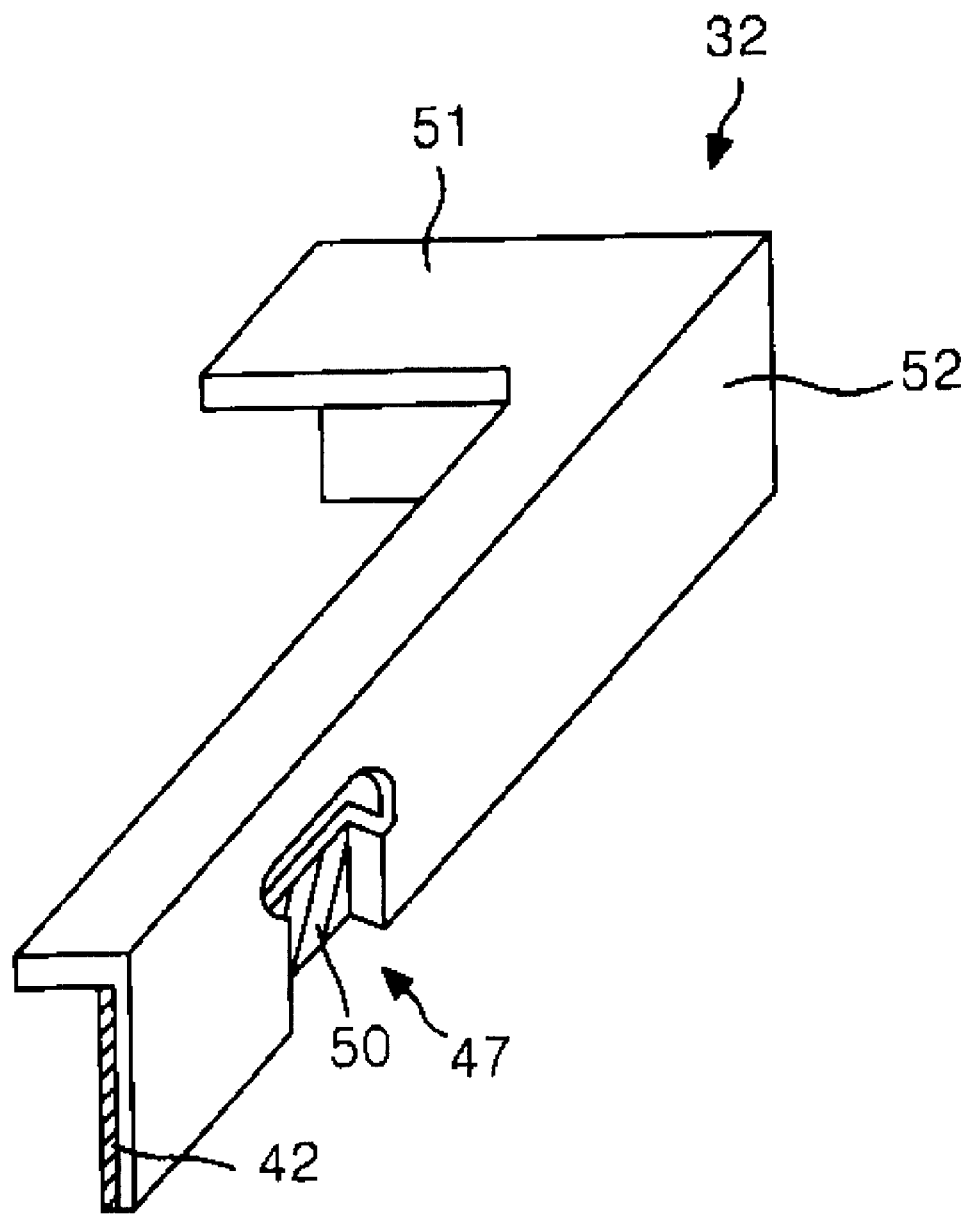
FIG. 8A is a perspective view of a conventional top case.

Referring to FIG. 8A, the top case 32 consists of a horizontal plane part 51 and a vertical plane part 52 bent vertically from the horizontal plane part 51. The vertical plane part 52 of the top case 32 is provided with a first copper film 42 and a second copper film 50 connected to a ground terminal (not shown). The first copper film 42 is provided at the inside of the vertical plane part 52 while the second copper film 50 is provided at a concave portion defined inwardly at the outside surface thereof. The plate 33 takes a shape as shown in FIG. 8b so as to contact the PCB 34 with the first and second copper films 42 and 50 of the top case 32.

Figure 8B:
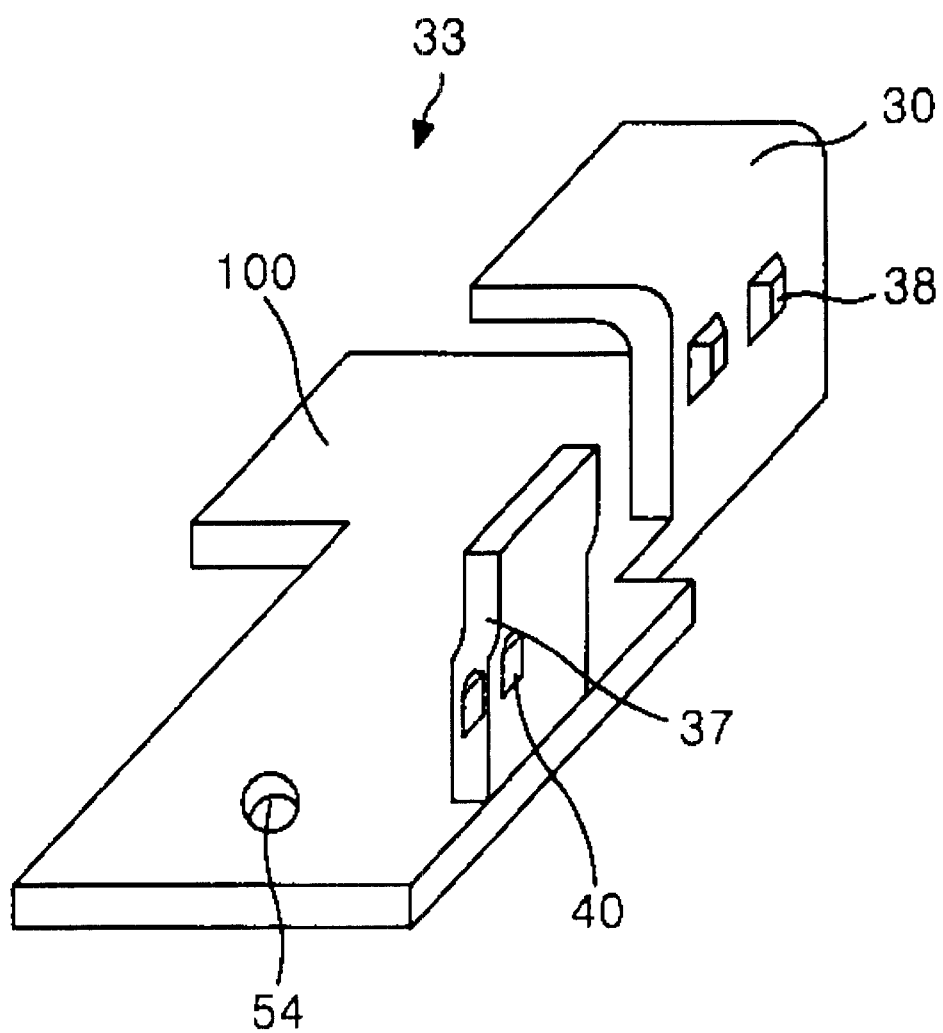
FIG. 8B is a perspective view of a conventional plate.

Referring to FIG. 8B, the plate 33 includes a horizontal plane part 100 on which the PCB 34 is put, a outer vertical supporting member 37 extended vertically from one side thereof, and an inner vertical supporting member 30 extended vertically and bent from a portion dented inwardly at one side thereof.

The horizontal plane part 100 is provided with a first screw hole 54 for fixing the PCB 34. The outer vertical supporting member 37 is provided with at least one first protrusion 40 to be in contact with the second copper film 50 at the concave portion 47 of the top case 32. The inner vertical supporting member 30 is provided with at least one second protrusion 38 to be in contact with the first film formed at the inside of the top case 32.

The plastic frame 92 in FIG. 6 is inserted between the horizontal plane part 100 and the outer and inner vertical supporting members 37 and 30. The top case 32 is inserted between the inner and outer vertical supporting members 30 and 37 of the plate 33.

Accordingly, the second protrusion 38 of the plate 33 is in contact with the first copper film 42 formed at the inside of the top case 32 while the first protrusion 40 of the plate 33 is in contact with the second copper film 50 formed at the concave portion 47 of the top case 32. Thus, a static electricity generated from the driving circuitry mounted onto the PCB 34 contacts the first and second copper films 42 and 50 of the top case 32 via the first and second protrusions 40 and 38 of the plate 33 to flow into a ground terminal. In other words, the PCB 34 is in contact with the first and second copper film 42 and 50 of the top case 32 via the plate 33 and thus grounded, thereby protecting the PCB 34 from a static electricity.

This will be described in detail with reference to FIG. 9A and FIG. 9B below.

Figure 9A:
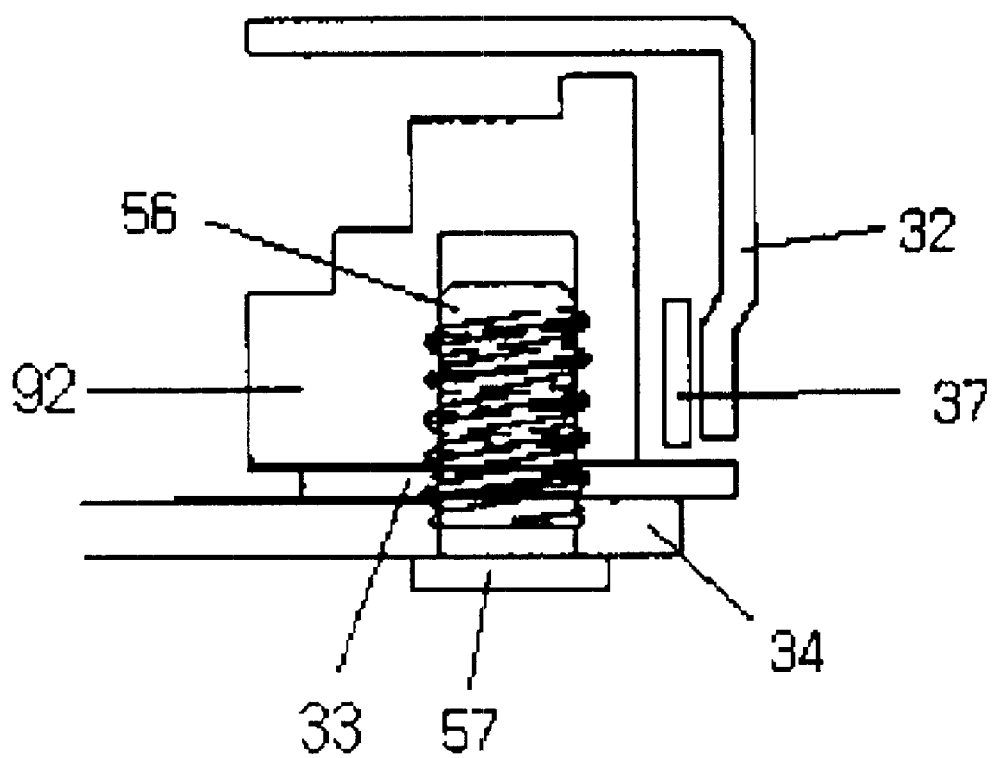
FIG. 9A is a section view taken along the E–E' line in FIG. 7A.
Figure 9B:
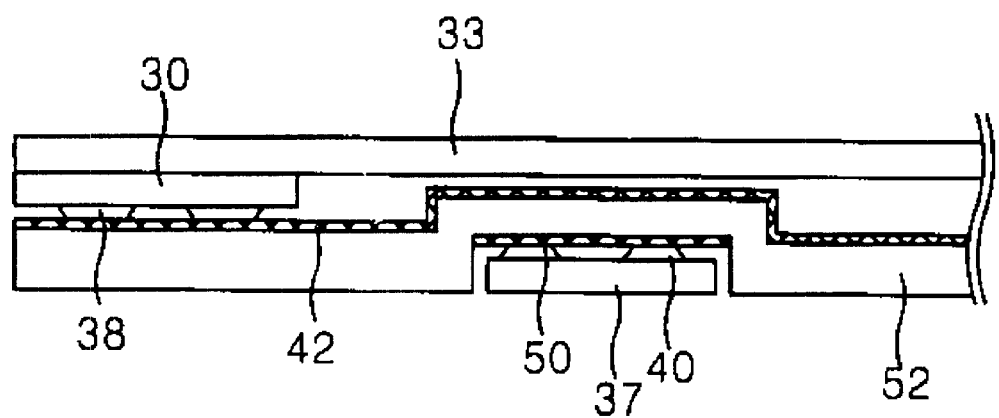
FIG. 9B is a section view taken along the F–F' line in FIG. 7B.

FIG. 9A is a section view taken along the line E–E' line in FIG. 7A, and FIG. 9B is a section view taken along the line F–F' line FIG. 7B.

Referring to FIG. 9A and FIG. 9B, the PCB 34 becomes in contact with the plate 33 and fixed by passing a first screw 57 through a hole (not shown) defined on the PCB 34 and through a first screw hole 54 defined at the plate 33 and then engaging it to a first screw hole 56 defined at the plastic frame 92.

The plate 33 is fixed by passing a second screw (not shown) through a second screw hole (not shown) defined at the plate 33 and then inserting it into a second screw hole (not shown) defined at the plastic frame 92. The first and second protrusions 40 and 38 formed at the outer and inner vertical supporting members 30 and 37 of the plate 33 is in contact with the first and second copper films 42 and 50 of the top case 32. Accordingly, the PCB 34 is earthed to the first and second copper films 42 and 50 via the plate 33, to thereby be protected from a static electricity generated upon assembly work and a static electricity generated from the interior of the system.

Further, the top case 32 covers the outer side of the PCB 34 and the plate 33, etc. by engaging a third screw 68 to the plastic frame 92 through a third screw hole 66 shown in FIG. 7A and FIG. 7B. At this time, the top case 32 is drawn inwardly or widened outwardly by an engaging force of the third screw 68.

When the top case 32 is widened outwardly by said engaging force, the second protrusion 40 provided at the outer vertical supporting member 37 of the plate 33 becomes in contact with the second copper film 50 formed at the concave portion 47 of the top case 32. On the other hand, when the top case 32 is drawn inwardly, the first protrusion 38 provided at the inner vertical supporting member 30 of the plate 33 becomes in contact with the first copper film 42 provided at the inside of the top case 32. Accordingly, even though the top case 32 is drawn inwardly or widened outwardly by an engaging force of the second screw force 68, the plate 33 comes in contact with the first and second copper films 42 and 50. As a result, the PCB 34 is always in a ground state.

As described above, according to the present invention, the plate is in double contact with the inside and the outside of the top case, so that the plate can be in contact with the top case in spite of a movement of the top case. Accordingly, the PCB is always earthed by said contact between the plate and the top case, so that it becomes possible to prevent the driving circuitry mounted onto the PCB from being damaged due to a static electricity.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A liquid crystal display module, comprising:
   a printed circuit board for applying signals to a liquid crystal display panel;
   a top case having a horizontal plane part and a vertical plane part to enclose an edge of the liquid crystal display panel; and
   a plate, in contact with the printed circuit board, having an outer vertical supporting member being in contact with an outer surface of the vertical plane part of the top case for grounding the printed circuit board.

2. The liquid crystal display module as claimed in claim 1, wherein the top case includes a concave portion at the outer surface of the vertical plane part to be in contact with an surface of outer vertical supporting member.

3. The liquid crystal display module as claimed in claim 2, wherein the outer vertical supporting member has at least one protrusion being in contact with concave portion of the top case.

4. The liquid crystal display module as claimed in claim 1, wherein the plate includes an inner vertical supporting member formed vertically to be in contact with an inner surface of the vertical plane part of the top case.

5. The liquid crystal display module as claimed in claim 4, wherein the inner vertical supporting member has at least one protrusion for providing contact with the vertical plane part of the top case.

6. The liquid crystal display module as claimed in claim 1, wherein the top case includes a conductive material.

7. The liquid crystal display module as claimed in claim 6, wherein the conductive material includes a copper film.

8. The liquid crystal display module as claimed in claim 2, wherein the concave portion is provided with a conductive material for grounding the printed circuit board.

9. The liquid crystal display module as claimed in claim 8, wherein the conductive material includes a copper film.

10. The liquid crystal display module as claimed in claim 1, wherein the plate includes a conductive material.

11. A liquid crystal display module, comprising:
- a printed circuit board for applying signals to a liquid crystal display panel;
- a top case having a horizontal plane part and a vertical plane part bent vertically from the horizontal plane part to enclose an edge of the liquid crystal display panel;
- a plate, in contact with the printed circuit board, having an outer vertical supporting member being in contact with an outer surface of the vertical plane part of the top case for grounding the printed circuit board; and
- a plastic frame for supporting the plate.

12. The liquid crystal display module as claimed in claim 11, wherein the top case includes a concave portion at the outer surface of the vertical plane part to be in contact with the outer vertical supporting member.

13. The liquid crystal display module as claimed in claim 12, wherein the outer vertical supporting member has at least one protrusion being in contact with the concave portion of the top case.

14. The liquid crystal display module as claimed in claim 11, wherein the plate includes an inner vertical supporting member formed vertically to be in contact with an inner surface of the vertical plane part of the top case.

15. The liquid crystal display module as claimed in claim 14, wherein the inner vertical supporting member has at least one protrusion for providing contact with the vertical plane part of the top case.

16. The liquid crystal display module as claimed in claim 11, wherein the top case includes a conductive material.

17. The liquid crystal display module as claimed in claim 16, wherein the conductive material includes a copper film.

18. The liquid crystal display module as claimed in claim 12, wherein the concave portion is provided with a conductive material for grounding the printed circuit board.

19. The liquid crystal display module as claimed in claim 18, wherein the conductive material includes a conductive material.

20. The liquid crystal display module as claimed in claim 11, wherein the plate includes a conductive material.

* * * * *